United States Patent [19]

Grellmann et al.

[11] Patent Number: 4,686,492

[45] Date of Patent: Aug. 11, 1987

[54] IMPEDANCE MATCH CONNECTION USING MULTIPLE LAYERS OF BOND WIRES

[75] Inventors: H. Erwin Grellmann, Beaverton; Leonard A. Roland, Portland, both of Oreg.

[73] Assignee: Tektronix, Inc., Beaverton, Oreg.

[21] Appl. No.: 708,129

[22] Filed: Mar. 4, 1985

[51] Int. Cl.⁴ .................................................. H01P 5/00
[52] U.S. Cl. ..................................... 333/33; 333/246; 333/260; 361/404; 174/68.5; 29/829; 29/850
[58] Field of Search ................. 333/238, 33, 246, 247, 333/260, 24 R; 361/404, 395, 414; 174/68.5; 339/11 E; 29/829, 830, 842, 846, 850

[56] References Cited

U.S. PATENT DOCUMENTS

| | | | |
|---|---|---|---|
| 3,688,396 | 9/1972 | Kilby et al. | 174/68.5 X |
| 3,852,878 | 12/1974 | Munro | 361/413 X |
| 3,862,790 | 1/1975 | Davies et al. | 174/68.5 X |
| 4,070,084 | 1/1978 | Hutchison | 333/260 X |
| 4,543,544 | 9/1985 | Ziegner | 333/238 X |
| 4,593,243 | 6/1986 | Lao et al. | 333/238 X |

Primary Examiner—Eugene R. LaRoche
Assistant Examiner—Benny Lee
Attorney, Agent, or Firm—William O. Geny; Francis I. Gray

[57] ABSTRACT

A bond wire connection between two semiconductor devices alleviates the problem of inductive loading at high frequencies by providing a capacitive effect which compensates for inductive reactance. The capacitive effect is provided by utilizing multiple parallel layers of bond wires at a common electrical connection point. As more layers are added the net impedance can be controlled so as to match the impedance driving the downstream semiconductor.

14 Claims, 2 Drawing Figures

U.S. Patent        Aug. 11, 1987        4,686,492

IMPEDANCE MATCH CONNECTION USING MULTIPLE LAYERS OF BOND WIRES

BACKGROUND OF THE INVENTION

The following invention relates to a method and apparatus for connecting two electrical devices and, in particular, semiconductor devices, by means of a bond wire connection that simulates the electrical properties of a transmission line and is thus free from inductive reactance at high frequencies.

Small integrated circuit elements such as microprocessors are typically connected to other semiconductos or circuit elements such as hybrid integrated circuits by wire bonding. The wire bonding technique utilizes a special machine to fuse extremely small diameter wires to the contact points or bond pads of these smaller IC chips. This method of physical interconnection of one semiconductor device to another is adequate where the upper limit of the frequency of the signal between the two devices is less than 10 megahertz. Bond wires, however, are inductive and at frequencies of around 100 megahertz, the inductance of the bond wire begins to create a reactive component in the connection of a magnitude which attenuates the signal level. This attenuation takes the form of a subtraction effect that occurs when a certain portion of the input frequency wave is reflected back to the source from the bond wire connection. At frequencies in the gigahertz range, the bond wire becomes an almost pure inductor which severely retards the incoming signal, and at a range of 10 to 30 gigahertz, there may be complete attenuation of the signal.

In hybrid IC chips, that is, relatively large chips which may include a ceramic substrate, high frequency RF signals are transmitted via a transmission line imprinted on the chip. Such transmission lines are described generally in a text, Gupta, Garg, and Bahl, "Microstrip Lines and Slot Lines" (Artec House, Inc., 1979). The transmission line on such circuits may take the form of a coplanar wave guide which includes a signal-carrying conductor flanked on opposite sides by a pair of ground plane conductors. All of the conductors extend substantially parallel to one another and are coplanar. It is at the interface between the transmission line of the hybrid IC chip and a smaller integrated circuit usually referred to as a die that the bond wire connection described above is made. The transmission line of the hybrid IC is fully capable of handling frequencies in the gigahertz range, but the inductive problem described above is encountered when attempting to connect the IC die to the hybrid IC transmission line.

SUMMARY OF THE INVENTION

The inductive problem posed by wire bond connection is solved in the present invention by providing a connection that simulates the transmission line of the hybrid IC in a configuration that essentially preserves the approximate predetermined impedance of the transmission line. In this way the impedance remains constant from medium to medium and thus there is no attenuation of the signal due to inductive loading at the connection between the hybrid IC and the smaller IC die. The invention includes a plurality of substantially coplanar layers of bond wires, each layer comprising a signal-carrying line flanked on both sides thereof by a ground line. The number of layers of bond wires is chosen to provide a connection whose impedance approximates the impedance of the transmission line or approximates a common impedance between the output of one electrical device and the input of the other electrical device. The connections are made so that respective curvilinear paths formed by each wire in each layer of bond wires are substantially parallel. This makes the spacing between adjacent wires constant. These adjacent parallel layers are capacitive which compensates for the fundamentally inductive nature of the bond wire connection. The respective bond wires which form portions of each of the layers lie in common vertical planes which are substantially perpendicular to either the IC die or the hybrid IC. Each wire in a vertical plane is spaced apart from the wires above and below it a constant distance over its curvilinear path.

The electrical connection is made by making a first electrical connection between the two devices comprising a first layer of bond wires, the layer including a signal line flanked on both sides by a ground line and attached at a first set of contact points on each respective electrical device. Next the impedance of this electrical connection is determined. Additional capacitance is provided for the connection by adding a second parallel electrical connection comprising a second layer of bond wires also including a signal line flanked on both sides by a ground line, of substantially the same configuration as the first electrical connection. Next, the cumulative impedance of the first and second electrical connections is determined. This impedance should be lower because the capacitance provided by the second bond wire layer compensates for the inductive loading created by the first layer. If this impedance, however, does not approximate the predetermined impedance sought to be matched, additional layers of bond wires are attached until the impedance of the cumulative connection reaches the predetermined impedance.

It is a primary object of this invention to provide a means of connecting two electrical devices in which signal attenuation caused by inductive reactance at high frequencies is eliminated.

A further object of this invention is to provide a multiple bond wire connection between two electrical devices which simulates an electrical transmission line.

Yet a further object of this invention is to provide an electrical connection between two electrical devices utilizing conventional wire bonding techniques where the impedance of the wire bond matches the output/input impedances of the two electrical devices respectively.

Yet a further object of this invention is to provide an electrical connection between two electrical devices utilizing parallel layers of bond wires wherein the capacitive loading caused by multiple bond wire layers compensates for the inductive loading inherent in each bond wire connection.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 1:
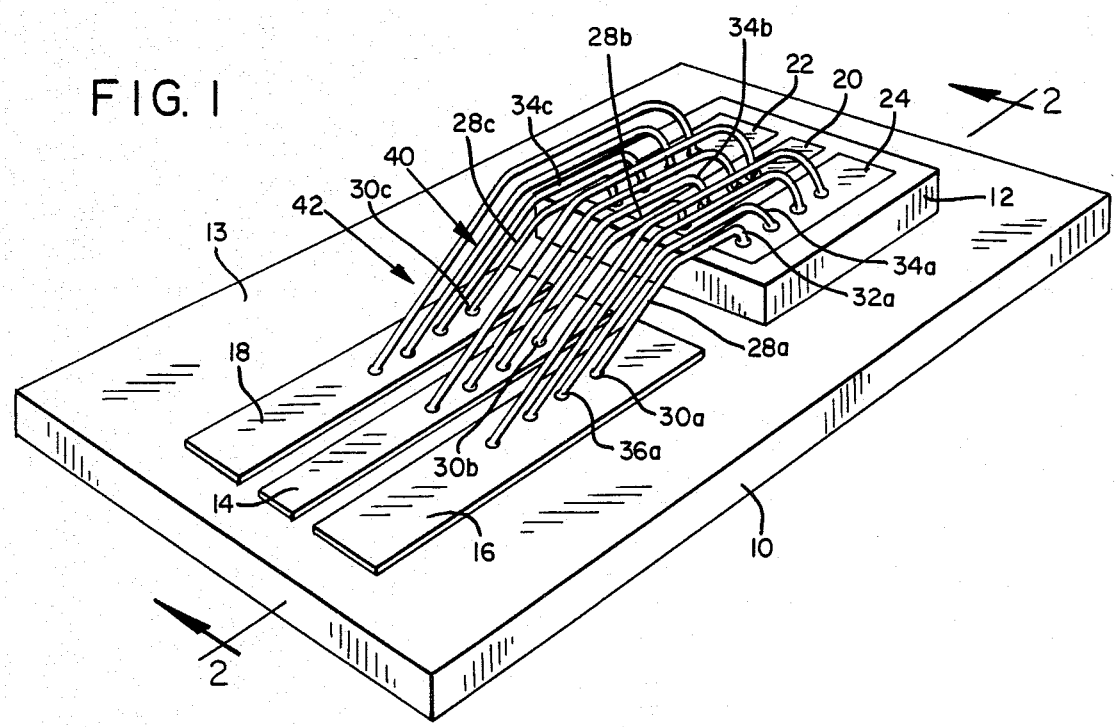
FIG. 1 is a schematic perspective view of a bond wire connection between an IC die and a hybrid integrated circuit utilizing the present invention.

Two electrical devices, a hybrid 10 and an IC die 12 are connected by a plurality of bond wire connections. The hybrid 10 contains a coplanar transmission line on top of a ceramic substrate 13 consisting of signal-carrying strip 14, ground plane conductor 16 and ground plane conductor 18. The IC die 12 contains a bond pad or contact strip 20 for the signalcarrying lines and two adjacent blanking ground bond pads 22 and 24 on both sides of the bond pad.

Figure 2:
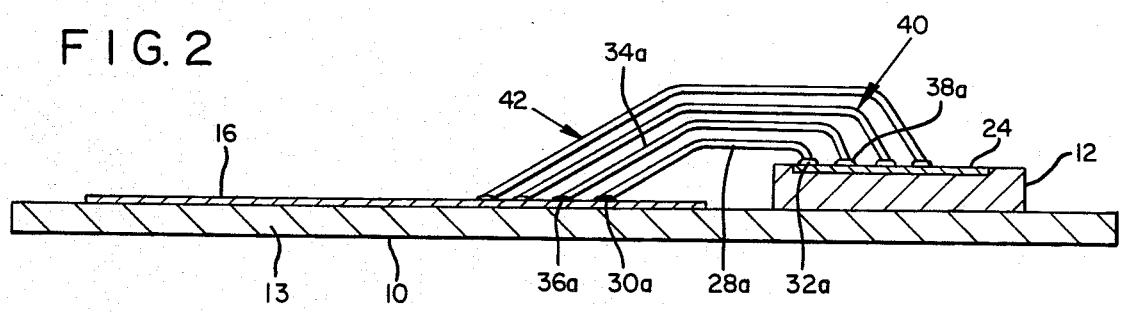
FIG. 2 is a side view taken along line 2—2 in FIG. 1 of the bond wire connection shown in FIG. 1.

The particular bond wire connection of the preferred embodiment includes four sets of bond wires arranged in layers. The first layer comprises bond wires 28a, 28b and 28c. The bond wires 28a, 28b and 28c follow parallel curvilinear paths, as best illustrated in FIG. 2, from a first set of contact points 30a, 30b and 30c on the hybrid 10 to a set of contact points such as 32a on bond pads 20, 22 and 24 on the IC die 12. Contact point 30b is located on signal-carrying strip 14, contact point 30a is located upon ground plane 16 and contact point 30c is located on ground plane 18. The bond wires 28a, 28b and 28c are connected to the IC die 12 at respective contact points including point 32a (contact points for wires 28b and 28c not shown).

The bond wires 28a, 28b and 28c have a generally curvilinear shape and are parallel to one another. The precise shape of the wires 28a, 28b and 28c is not critical, however, all of the wires in a layer should follow the same general curvilinear path and should be parallel to one another, so that the spacings between horizontally adjacent wires is constant over their respective lengths. Each wire has a thickness of approximately 1.0 mil.

Superimposed over the first set of wires is a second layer of bond wires consisting of wires 34a, 34b and 34c. This layer of wires is placed over the first layer of wires so as to be generally parallel thereto so that the spacing between vertically adjacent wires remain constant over the lengths of the respective wires. In addition, the individual wires 34a, 34b and 34c lie in a vertical plane with wires 28a, 28b and 28c, respectively, such that each of the three vertical planes is substantially perpendicular to the surface of the IC die 12 and the hybrid 10. Thus, for example, wire 34a lies directly on top of wire 28a and is attached at contact points 36a and 38a which are displaced farther apart on ground line 16 and bond pad 24, respectively, in the axial direction of the wire 34a. As shown in FIG. 2, the result of this orientation is that each layer of bond wires is substantially parallel to the layers above and below it along the generally curvilinear paths of the parallel wires in each layer.

Additional layers of wires may be added depending upon the impedance between the hybrid 10 and the IC die 12. The preferred embodiment includes four such layers of bond wires, this choice having been determined empirically by calculating the cumulative impedance resulting from four layers of bond wires and matching that impedance to the common impedance between the hybrid 10 and the IC die 12.

Although the wires in each vertical plane are connected to different contact points between the hybrid 10 and the IC die 12, the electrical value of the connection is very nearly the same. For example, point 30a is the same electrically as point 36a. Similarly, point 32a is the same electrically as point 38a (FIG. 2), the only difference being that the respective contact points for an upper wire are displaced farther apart axially from the bond wire immediately beneath it. Additional bond wire layers, such as layers 40 and 42 may also be provided, it being understood that the individual wires of those layers are configured according to the same scheme as that used for bond wires 28a and 34a. That is, each wire in a layer must follow substantially the same curvilinear path which must also be substantially parallel to the wires above and below it and there must be constant spacings between vertically adjacent wires.

The wires with their respective contact points on the respective electrical devices are spaced uniformly apart. For the embodiment shown in FIGS. 1 and 2, this space is on the order of five mils. Thus the space between contact points 32a and 38a is five mils and likewise the space between contact points 30a and 36a is five mils. This same spatial relationship holds true for the wires in layers 40 and 42.

The number of layers of bond wires needed to provide a predetermined impedance Z may be determined empirically. For the first layer of wires 28a, 28b and 28c it is first necessary to determine the inductance L at the highest frequency expected to be encountered. As explained above, this frequency may be in the range between 10 and 30 gigahertz. The mutual and selfinductance of a set of small round wires may be determined through the use of Neumann's formula as generally set forth in a text, "Introduction to Electromagnetic Fields and Waves", Corson and Lorrain, (WH Freeman & Company, 1962), at section 6.3, page 230. Once the inductance L has been determined, it must then be determined what effect a second layer of bond wires, superimposed spatially over the first, would have on the overall impedance of the connection. It is well recognized in the art that a finite capacitance C exists between two parallel small round wires that are closely adjacent one another and carry electric currents. The capacitive effect of a second layer of wires may be determined by employing a mathematical analysis described in a second text entitled "Multiconductor Transmission Line Analysis" by Sidney Frankel (Artec House Inc., 1977) at section 8.1 et. seq., page 215. Once the capacitive effect of a second layer of wires is known, the cumulative impedance of the two wire layers may be calculated by taking the square root of the ratio of the inductance to the capacitance, that is $Z=\sqrt{L/C}$. If this impedance is substantially equal to the predetermined matching impedance Z, then a second layer of bond wires is all that is needed. If, however, the impedance remains too high, it is because a second layer of wires does not provide enough capacitance to offset the inductance of the first and second sets. Before adding a third layer of wires, however, it is first necessary to determine the inductance of the first and second layers because adding a second layer alters the cumulative inductive reactance of the connection. This may be done by using the Neumann formula in Corson and Lorrain. Having determined the inductance, it is then necessary to determine the capacitive effect of adding a third bond wire layer. This may again be accomplished by utilizing the technique outlined in the Frankel text. Knowing the capacitance one may then determine the cumulative impedance for all three layers of bond wires. This iterative technique is repeated, adding layers of bond wires until the impedance substantially matches the predetermined impedance Z. Z will usually be the output impedance of the hybrid IC chip 10 and the input impedance of the IC die 12. Typically this impedance is designed to be kept as low as possible, and is usually on the order of 50 ohms.

Physically the wires are bonded to the respective contact pads on the IC die 12 and the hybrid 10 by a special-purpose machine such as a programmable automatic wire-bonding machine. Such machines are capable of maintaining a distance between adjacent (axial) contact points of 5 mils. If a closer spacing can be maintained it should be employed because the capacitance between layers varies inversely with the distance between the individual wires in the vertical planes. Thus with closer vertical interwire spacings fewer layers may be required for proper impedance matching.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

I claim:

1. A very high frequency electrical connection between a pair of electrical devices comprising a plurality of layers of bond wires, each layer having a signal-carrying line flanked on both sides thereof by a ground line, each electrical device having a plurality of contact points corresponding to the signal-carrying line and the ground lines between which respective bond wires are attached to connect the pair of electrical devices.

2. The connection of claim 1 wherein the plurality of said layers of bond wires is chosen to provide a connection whose impedance approximates a predetermined matching impedance at the desired operating frequency of the electrical devices.

3. The connection of claim 2 wherein each wire in each of said layers has a diameter of 1.0 mil.

4. The connection of claim 3 wherein each wire is made of a highly conductive metal.

5. The connection of claim 1 wherein one of said electrical devices is a hybrid integrated circuit and the other of said devices is an IC die.

6. The connection of claim 1 in which each bond wire in each layer follows a predetermined path, said paths being shaped such that each of said layers of bond wires are substantially in parallel to each other so as to provide constant spacing between adjacent ones of said layers of bond wires.

7. The connection of claim 6 in which each of the respective bond wires forming a common electrical connection in said layers lie in common planes substantially perpendicular to a surface of at least one of said electrical devices.

8. The connection of claim 7 wherein said constant spacing between adjacent ones of said layers of bond wires is approximately five mils.

9. A method of connecting two electrical devices together so as to simulate a very high frequency transmission line coupling between said electrical devices comprising:

(a) making a first electrical connection by connecting between the two devices a first layer of bond wires, said layer including a signal line flanked on both sides thereof by a ground line, each of said lines defining a predetermined path lying generally along a longitudinal axis between the devices, each of said lines being attached at a first set of contact points on each respective electrical device;

(b) determining the inductance of said first electrical connection at the operating frequency of the devices;

(c) providing additional capacitance for said connection by adding a second parallel electrical connection by connecting between the two devices a second layer of bond wires including a signal line flanked on both sides by a ground line;

(d) determining the cumulative impedance of said first and second electrical connections at the operating frequency of the devices; and (e) repeating steps (c) and (d), adding n layers of bond wire connections until a predetermined cumulative matching impedance is achieved.

10. The method of claim 9 further including the step of arranging each of the lines in the nth connection along a predetermined path with respect to the respective corresponding lines of the first layer and attaching said lines at an nth set of points on each of said respective electrical devices having the same electrical value but displaced farther apart along the respective longitudinal axes of the lines than the n−1 layer such that a constant spacing exists between the nth and the n−1 layers.

11. The method of claim 9 wherein the lines are made of a highly conductive metal.

12. The method of claim 9 wherein the lines are connected to each electrical device using a programmable wire bonding machine.

13. The method of claim 9 wherein the electrical devices are semiconductors.

14. The method of claim 9 wherein the wires in each respective layer are arranged to follow substantially parallel paths from one electrical device to the other electrical device.

* * * * *